(12) United States Patent
Jacobson et al.

(10) Patent No.: US 8,339,823 B2
(45) Date of Patent: Dec. 25, 2012

(54) VOLTAGE SOURCE CONVERTER

(75) Inventors: Björn Jacobson, Grängesberg (SE);
Gunnar Asplund, Solna (SE)

(73) Assignee: ABB Technology AG, Zurich (CH)

( * ) Notice: Subject to any disclaimer, the term of this patent is extended or adjusted under 35 U.S.C. 154(b) by 282 days.

(21) Appl. No.: 12/933,623

(22) PCT Filed: Mar. 20, 2008

(86) PCT No.: PCT/EP2008/053386
§ 371 (c)(1),
(2), (4) Date: Nov. 1, 2010

(87) PCT Pub. No.: WO2009/115124
PCT Pub. Date: Sep. 24, 2009

(65) Prior Publication Data
US 2011/0038193 A1  Feb. 17, 2011

(51) Int. Cl.
*H02M 1/00* (2007.01)
(52) U.S. Cl. .................. 363/144; 363/178
(58) Field of Classification Search .......... 363/144, 363/178, 16, 147
See application file for complete search history.

(56) References Cited

U.S. PATENT DOCUMENTS

| | | | |
|---|---|---|---|
| 4,636,917 A | 1/1987 | Jouanny | |
| 5,705,853 A | 1/1998 | Faller et al. | |
| 6,738,258 B2 | 5/2004 | Bijlenga et al. | |
| 7,542,317 B2 * | 6/2009 | Azuma et al. | 363/123 |
| 2003/0122261 A1 | 7/2003 | Bijlenga et al. | |
| 2006/0180932 A1 | 8/2006 | Otremba et al. | |
| 2008/0232145 A1 | 9/2008 | Hiller et al. | |

FOREIGN PATENT DOCUMENTS

| | | |
|---|---|---|
| DE | 3430194 A1 | 3/1985 |
| DE | 101 03 031 A1 | 1/2001 |
| DE | 101 03 031 A1 | 7/2002 |
| DE | 10 2005 001 151 A1 | 7/2006 |
| EP | 1 318 545 A1 | 6/2003 |
| EP | 1 318 547 A1 | 6/2003 |
| JP | 59-110149 A | 6/1984 |
| JP | 2008-16601 A | 1/2008 |
| WO | WO 02/097883 A1 | 12/2002 |
| WO | WO 2004/028748 A2 | 4/2004 |
| WO | WO 2007/023064 A1 | 3/2007 |

* cited by examiner

*Primary Examiner* — Shawn Riley
(74) *Attorney, Agent, or Firm* — Birch, Stewart, Kolasch & Birch, LLP

(57) ABSTRACT

A Voltage Source Converter having at least one phase leg connected to opposite poles of a direct voltage side of the converter and comprising a series connection of switching elements including at least one energy storing capacitor and configured to obtain two switching states, namely a first switching state and a second switching state, in which the voltage across said at least one energy storing capacitor and a zero voltage, respectively, is applied across the terminals of the switching element, has semiconductor chips of said switching elements arranged in stacks comprising each at least two semiconductor chips. The converter comprises an arrangement configured to apply a pressure to opposite ends of each stack.

20 Claims, 5 Drawing Sheets

VOLTAGE SOURCE CONVERTER

TECHNICAL FIELD OF THE INVENTION AND BACKGROUND ART

The present invention relates to a Voltage Source Converter having at least one phase leg connecting to opposite poles of a direct voltage side of the converter and comprising a series connection of switching elements, each said switching element having on one hand at least two semiconductor chips having each a semiconductor device of turn-off type and a free-wheeling diode connected in parallel therewith and on the other at least one energy storing capacitor, a mid point of said series connection forming a phase output being configured to be connected to an alternating voltage side of the converter and to divide the phase leg into an upper valve branch and a lower valve branch, each said switching element being configured to obtain two switching states by control of said semiconductor devices of each switching element, namely a first switching state and a second switching state, in which the voltage across said at least one energy storing capacitor and a zero voltage, respectively, is applied across the terminals of the switching element, for obtaining a determined alternating voltage on said phase output.

Such converters with any number of said phase legs are comprised, but they have normally three such phase legs for having a three phase alternating voltage on the alternating voltage side thereof.

A Voltage Source Converter of this type may be used in all kinds of situations, in which direct voltage is to be converted into alternating voltage or conversely, in which examples of such uses are in stations of HVDC-plants (High Voltage Direct Current), in which direct voltage is normally converted into a three-phase alternating voltage or conversely, or in so-called back-to-back-stations in which alternating voltage is firstly converted into direct voltage and this is then converted into alternating voltage. It may also be used to absorb or inject reactive power in the alternating voltage network.

A Voltage Source Converter of this type is known through for example DE 101 03 031 A1 and WO 2007/023064 A1 and is normally called a multi-cell converter or M2LC. Reference is made to these publications for the functioning of a converter of this type. Said switching elements of the converter may have other appearances than those shown in said publications, and it is for instance possible that each switching element has more than one said energy storing capacitor, as long as it is possible to control the switching element to be switched between the two states mentioned in the introduction.

The present invention is primarily, but not exclusively, directed to such Voltage Source Converters configured to transmit high powers, and the case of transmitting high powers will for this reason mainly be discussed hereafter for illuminating but not in any way restricting the invention thereto. When such a Voltage Source Converter is used to transmit high powers this also means that high voltages are handled, and the voltage of the direct voltage side of the converter is determined by the voltages across said energy storing capacitors of the switching elements and is normally set to be half the sum of these voltages. This means that a comparatively high number of such switching elements are to be connected in series or a high number of semiconductor devices, i.e. said semiconductor chips, are to be connected in series in each said switching element, and a Voltage Source Converter of this type is particularly interesting when the number of the switching elements in said phase leg is comparatively high, such as at least 8. A high number of such switching elements connected in series means that it will be possible to control these switching elements to change between said first and second switching state and already at said phase output obtain an alternating voltage being very close to a sinusoidal voltage. This may be obtained already by means of substantially lower switching frequencies than typically used in known Voltage Source Converters of the type shown in FIG. 1 in DE 101 03 031 A1 having switching elements with at least one semiconductor device of turn-off type and at least one free wheeling diode connected in anti-parallel therewith. This makes it possible to obtain substantially low losses and also considerably reduces problems of filtering and harmonic currents and radio interference, so that equipment therefor may be less costly.

However, the great number of switching elements connected in series and the energy storing capacitors belonging to these switching elements makes Voltage Source Converters of this type rather voluminous, so that for instance in the case of a station of a HVDC-plant very large valve halls are to be built for such converters.

SUMMARY OF THE INVENTION

The object of the present invention is to provide a Voltage Source Converter of the type defined in the introduction being improved in at least some aspect with respect to such Voltage Source Converters already known.

This object is according to the invention obtained by providing such a Voltage Source Converter, in which said semiconductor chips of said switching elements are arranged in stacks comprising each at least two semiconductor chips, and that the converter comprises an arrangement configured to apply a pressure to opposite ends of each said stack for pressing said chips towards each other so as to obtain electric contact between semiconductor chips in said stack.

By using this so-called presspack technique known through U.S. Pat. No. 5,705,853 this type of Voltage Source Converters may be made more compact than before, so that the dimensions may be reduced for especially buildings in the form of valve halls for such converters. The semiconductor chips in converters of this type have so far been connected by screw connections, which require more place for providing access to said screws or bolts for tightening thereof. Obtaining the electric contact between semiconductor chips by arranging them in a stack and pressing them towards each other also results in an increased reliability of such connections with respect to prior solutions.

According an embodiment of the invention said arrangement comprises means adapted to apply a spring loaded pressure to each said stack urging the two ends of the stack towards each other while releasing potential energy stored in members of said means. Said members may be of any type storing potential energy when compressed and are according to another embodiment of the invention springs acting on at least one end of each said stack, in which said springs may be mechanical springs as well as other types of springs, such as gas springs. This means that the electric contact between the semiconductor chips in said stack may be obtained with a high reliability irrespectively of irregularities in the dimension thereof, such as for instance in the case of parallel connection of semiconductor chips in said stack.

According to another embodiment of the invention said arrangement comprises two end plates configured to be arranged close to opposite ends of a said stack and elongated members interconnecting said plates while determining the distance therebetween, and said members storing potential energy are arranged to act between at least one of said plates and the corresponding end of said stack for urging this end plate and stack end apart while pressing the stack together. Said arrangement may then comprise means configured to allow a displacement of at least one of said plates along said interconnecting members in the longitudinal direction thereof for changing said distance and by that the pressure applied to said stack, so that the same equipment in the form of said arrangement may be used and adapted to different such stacks.

According to another embodiment of the invention said arrangement comprises a further plate configured to be applied onto one end of said stack and movable with respect to said elongated members in the longitudinal direction thereof, and said members storing potential energy are arranged to urge said further plate and a said end plate next thereto apart for pressing the stack together.

According to another embodiment of the invention said semiconductor chips have a plate-like structure and are arranged with large sides thereof directed in the direction of the extension of the stack.

According to another embodiment of the invention said at least two semiconductor chips belong to the same switching element, and adjacent semiconductor chips belonging to the same switching element are separated by a metal plate sandwiched therebetween for obtaining an electrical connection between the two chips by pressing them against said metal plate. This means that a reliable and excellent electric contact may be obtained between said semiconductor chips belonging to the same switching element.

According to another embodiment of the invention said metal plates are arranged on both sides of each said semiconductor chip, which is particularly preferable for the possibility to use such metal plates for cooling said semiconductor chips.

According to another embodiment of the invention each said stack comprises at least all semiconductor chips belonging to one switching element.

According to another embodiment of the invention each said stack comprises said semiconductor chips of a plurality of said switching elements, which makes the converter very compact.

According to another embodiment of the invention each said stack has the semiconductor chips of one switching element arranged in a sub-stack, all said sub-stacks to be pressed together by one and the same said arrangement are arranged on top of each other in one single stack, an electrically insulating layer is sandwiched between and separates adjacent such sub-stacks, and a conductor is arranged for electrically connecting adjacent sub-stacks and by that adjacent switching elements in said series connection to each other. This design of said stack makes it possible to arrange a number of switching elements, even all switching elements of a said valve branch, in one single stack making the converter very compact.

According to another embodiment of the invention said semi-conductor chips to be pressed together by one and the same said arrangement are arranged in at least two parallel stacks, each said parallel stack comprises a plurality of superimposed switching elements each having said semiconductor chips thereof arranged in a sub-stack, all said sub-stacks of each of said stacks are arranged on top of each other for forming one of said parallel stacks, an electrically insulating layer is sandwiched between and separates adjacent such sub-stacks, each sub-stack switching element comprises two metal plates separated by at least one semiconductor chip of this switching element, and said parallel stacks are mutually displaced in the longitudinal direction thereof, so that for each switching element said two metal plates belonging thereto connects to and are in common to different adjacent switching elements of the other parallel stack so as to obtain a series connection of two switching elements separated by a said insulating layer in one said parallel stack with a switching element of the other parallel stack arranged in this series connection between said two switching elements. This way of obtaining a series connection of said switching elements or cells in a zigzag-like pattern makes it possible to make the converter even more compact and reduce the size (length) of valve buildings.

According to another embodiment of the invention said metal plates are provided with channels and the converter comprises means configured to circulate a cooling medium in said channels for cooling said semiconductor chips adjacent to said metal plates, in which said cooling medium is preferably water, although other types of cooling media are conceivable. The use of this cooling technique results in a further advantage of the embodiment defined above having parallel stacks, since this means that the number of connections of cooling medium to the switching elements of the converter may be reduced to the half of the number required would the switching elements thereof not share such metal plates.

According to another embodiment of the invention each switching element comprises more than two said semiconductor chips arranged in a said stack. An advantage of having a larger number of semiconductor chips in each switching element is that costs may be saved due to a lower number of connections required to switching elements as a consequence of a lower number of switching elements. However, it is a trade off between this advantage and the advantage of a better quality of the alternating voltage obtained on said phase output would the number of switching elements or cells be higher.

According to another embodiment of the invention each said switching element has 2N said semiconductor chips following upon each other in a said stack, in which N is an integer 2.

According to another embodiment of the invention the number of the switching elements of said phase leg is $\geq 8$, 12-32, 16-24 or 50-150. A converter of this type is, as already mentioned above, particularly interesting when the number of switching elements of a said phase leg is rather high resulting in a high number of possible levels of the voltage pulses delivered on said phase output.

According to another embodiment of the invention said semi-conductor devices of the switching element chips are IGBTs (Insulated Gate Bipolar Transistor) or GTOs (Gate Turn-Off thyristor). These are suitable semiconductor devices for such converters, although other semiconductor devices of turn-off type, such as IGCTs are also conceivable.

According to another embodiment of the invention said converter is configured to have said direct voltage side connected to a direct voltage network for transmitting High Voltage Direct Current (HVDC) and the alternating voltage side connected to an alternating voltage phase line belonging to an alternating voltage network. This is due to the high number of semiconductor chips required a particularly interesting application of a converter of this type.

According to another embodiment of the invention the converter is configured to have a direct voltage across said two poles being 1 kV-1200 kV, 10 kV-1200 kV or 100 kV-1200 kV. The invention is the more interesting the higher said direct voltage is.

The invention also relates to a plant for transmitting electric power according to the appended claim therefor. The size of the stations of such a plant may be reduced with respect to such plants already known using a Voltage Source Converter of the type defined in the introduction.

Further advantages as well as advantageous features of the invention will appear from the following description.

BRIEF DESCRIPTION OF THE DRAWINGS

With reference to the appended drawings, below follows a description of embodiments of the invention cited as examples.

In the drawings.

DETAILED DESCRIPTION OF EMBODIMENTS OF THE INVENTION

Figure 1:
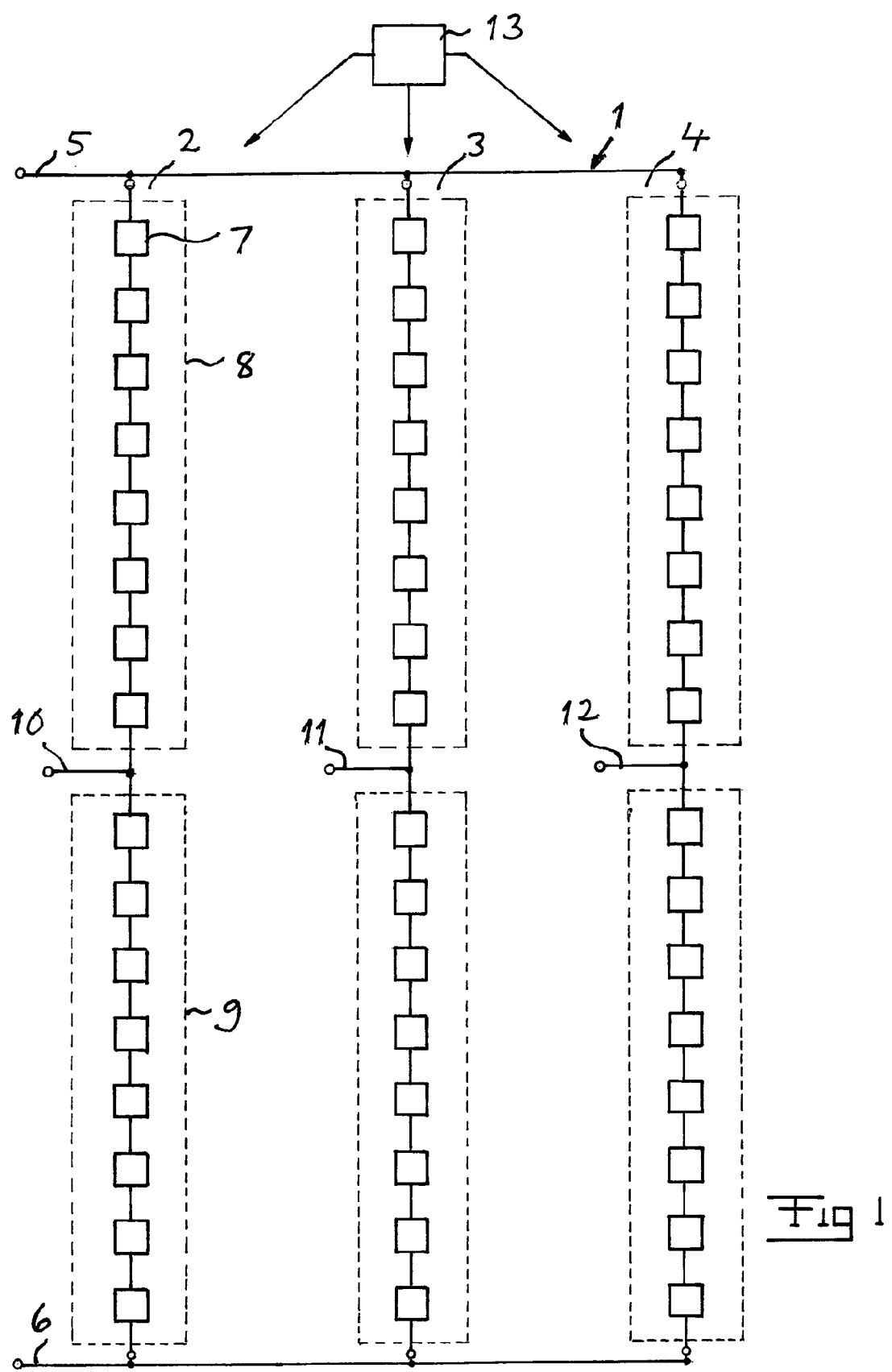
FIG. 1 is a very simplified view of a Voltage Source Converter of the type according to the present invention, FIG. 2

FIG. 1 illustrates very schematically the general construction of a Voltage Source Converter 1 of the type to which the present invention relates. This converter has three phase legs 2-4 connected to opposite poles 5, 6 of a direct voltage side of the converter, such as a direct voltage network for transmitting high voltage direct current. Each phase leg comprises a series connection of switching elements 7 indicated by boxes, in the present case 16 to the number, and this series connection is divided into two equal parts, an upper valve branch 8 and a lower valve branch 9, separated by a mid point 10-12 forming a phase output being configured to be connected to an alternating voltage side of the converter. The phase outputs 10-12 may possibly through a transformer connect to a three phase alternating voltage network, load, etc. Filtering equipment is also arranged on said alternating voltage side for improving the shape of the alternating voltage on said alternating voltage side.

A control arrangement 13 is arranged for controlling the switching elements 7 and by that the converter to convert direct voltage into alternating voltage and conversely.

Figure 2:
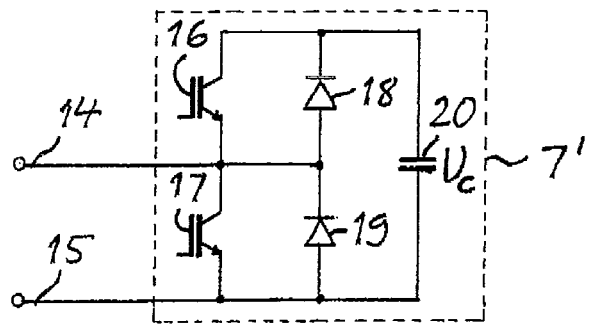
Figure 3:
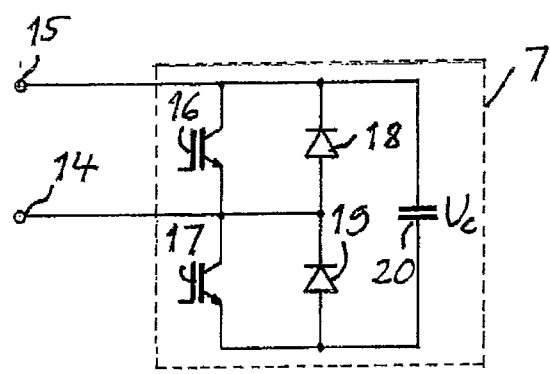
FIG. 3 illustrates two different known switching elements, which may be a part of a Voltage Source Converter according to the invention.

The Voltage Source Converter has switching elements 7 of the type having on one hand at least two semiconductor chips with each a semiconductor device of turn-off type, and a free wheeling diode connected in parallel therewith and on the other at least one energy storing capacitor, and two examples of such switching elements are shown in FIG. 2 and FIG. 3. The terminals 14, 15 of the switching element are adapted to be connected to adjacent switching elements in the series connection of switching elements forming a phase leg. The semiconductor devices 16, 17 are in this case IGBTs connected in parallel with diodes 18, 19. An energy storing capacitor 20 is connected in parallel with the respective series connection of the diodes and the semiconductor devices. One terminal 14 is connected to the mid point between the two semiconductor devices as well as the mid point between the two diodes. The other terminal 15 is connected to the energy storing capacitor 20, in the embodiment of FIG. 2 to one side thereof and in the embodiment according to FIG. 3 to the other side thereof. It is pointed out that each semi-conductor device and each diode as shown in FIG. 2 and FIG. 3 may be more than one connected in series for being able to handle the voltages to be handled, and the semiconductor devices so connected in series may then be controlled simultaneously so as to act as one single semiconductor device.

The switching elements shown in FIG. 2 and FIG. 3 may be controlled to obtain one of a) a first switching state and b) a second switching state, in which for a) the voltage across the capacitor 20 and for b) a zero voltage is applied across the terminals 14, 15. For obtaining the first state in FIG. 2 the semiconductor device 16 is turned on and the semiconductor device 17 turned off and in the embodiment according to FIG. 3 the semiconductor device 17 is turned on and the semiconductor 16 is turned off. The switching elements are switched to the second state by changing the state of the semiconductor devices, so that in the embodiment according to FIG. 2 the semiconductor device 16 is turned off and 17 turned on and in FIG. 3 the semiconductor device 17 is turned off and 16 turned on.

Figure 4:
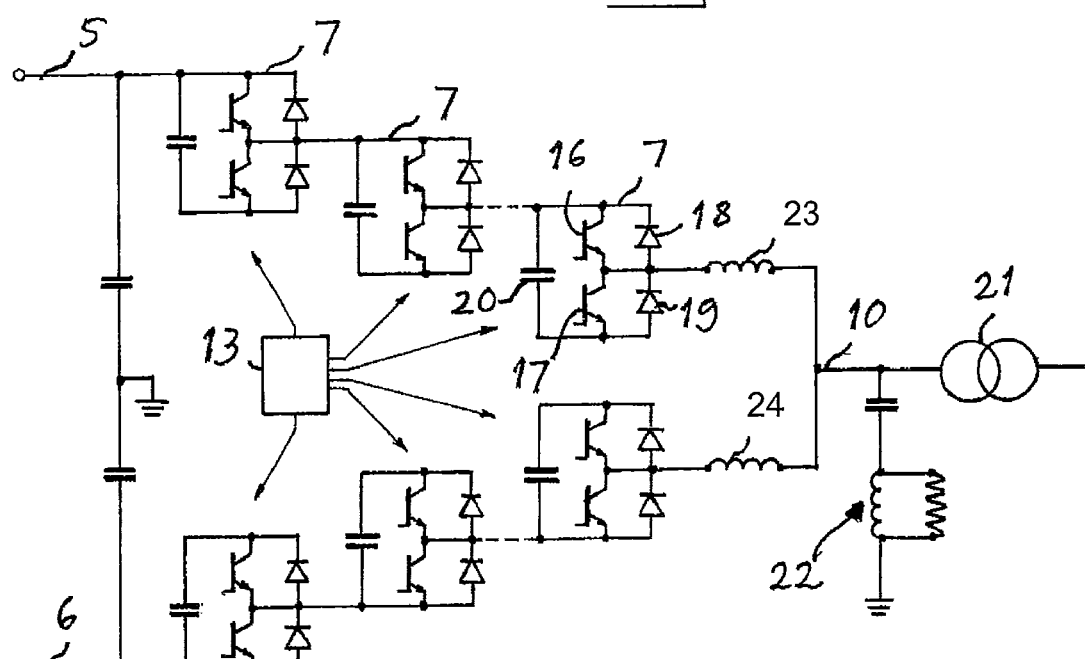
FIG. 4 is a simplified view very schematically illustrating a Voltage Source Converter according to the present invention.

FIG. 4 shows a little more in detail how a phase leg of the converter according to FIG. 1 is formed by switching elements of the type shown in FIG. 3, in which totally ten switching elements have been left out for simplifying the drawing. The control arrangement 13 is adapted to control the switching elements by controlling the semiconductor devices thereof, so that they will either deliver a zero voltage or the voltage across the capacitor to be added to the voltages of the other switching elements in said series connection. A transformer 21 and filtering equipment 22 are here also indicated. It is shown how each valve branch is through a phase reactor 23, 24 connected to the phase output 10, and such phase reactors should also be there in FIG. 1 for the phase outputs 10, 11 and 12, but have there been left out for simplifying the illustration.

Figure 5:
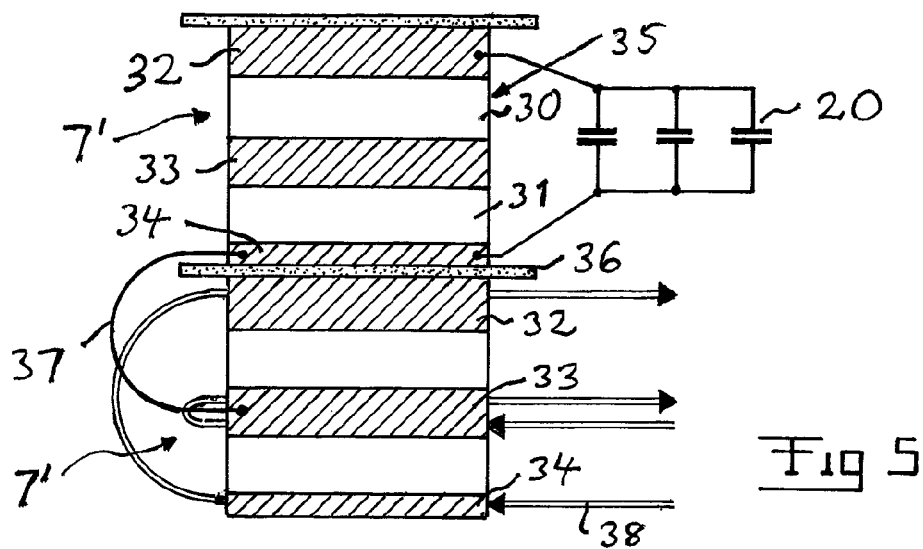
FIG. 5 is a simplified view illustrating how two switching elements may be superimposed in one single stack in a converter according to a first embodiment of the present invention.

FIG. 5 illustrates very schematically a part of a stack in the form of two switching elements 7' superimposed of the type shown in FIG. 2. Each switching element 7' comprises two semiconductor chips 30, 31 having each a semiconductor device of turn-off type and a free-wheeling diode connected in parallel therewith and having a plate-like structure with a metal plate 32-34 on each side of each semiconductor chip in a sub-stack 35 so formed. It is illustrated how switching elements following upon each other in said stack are electrically insulated with respect to each other through an insulating layer 36 separating the metal plates 34 and 32. Adjacent switching elements are connected to each other by an electrical conductor 37 in the form of a wire.

It is illustrated how ducts 38 transporting a cooling medium, such as cooling water, are connected to channels in the metal plates 32-34 for cooling the semiconductor chips located between these metal plates. In the present case the water is led through the plates 32, 33 and 34 for obtaining a cooling effect thereupon with the relationship 9:10:1, which indicates the cooling need of the different metal plates. Such cooling is of course provided for all the metal plates in the switching elements in the converter, although it has only been shown for the lower switching element in FIG. 5 for simplifying the drawings. This is of course also valid for example the energy storing capacitors 20 and the electrical conductor 37, which are only shown for one switching element.

Figure 6:
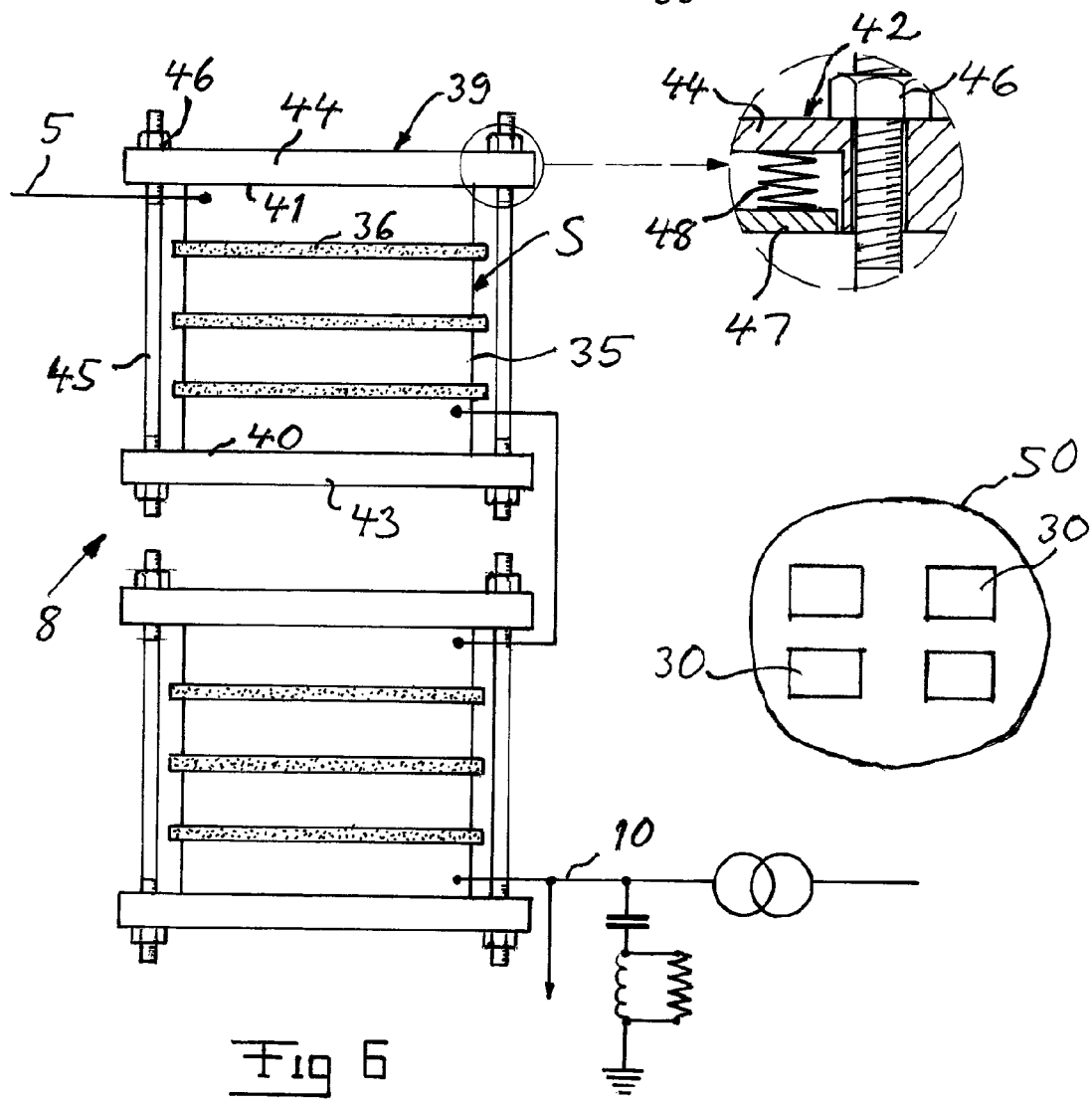
FIG. 6 is a simplified view illustrating the principle of obtaining and arranging stacks of switching elements of the type shown in FIG. 5 in a converter according to said first embodiment of the invention.

FIG. 6 illustrates how four such sub-stacks 35 of switching elements 7' according to FIG. 5 may be arranged in one single stack and provided with an arrangement 39 configured to apply pressure to opposite ends 40, 41 of the stack S for pressing the semiconductor chips 30, 31 towards the respective metal plates and towards each other so as to obtain electric contact between the semiconductor chips in the same sub-stack. This arrangement 39 comprises means 42 adapted to apply a spring loaded pressure to each said stack. The arrangement has two end plates 43, 44 configured to be arranged close to opposite ends of the stack and elongated members 45 in the form of rods, for instance of glass fibres, interconnecting the plates 43, 44 while determining the distance therebetween. The plates 43, 44 may be displaced with respect to each other by tightening or releasing nuts 46 located on threaded ends of the rods 45. A further plate 47 is configured to be applied onto one end of the stack and is movable with respect to the rods 45 in the longitudinal direction thereof. Spring members 48 storing potential energy are arranged to urge said further plate 47 and the end plate 44 next thereto apart for pressing the stack together. This results in a very reliable mutual contact of the semiconductor chips in the stack.

Only the upper valve branch 8 of the converter and the phase output 10 is shown in FIG. 6, and this converter has accordingly 8 switching elements connected in series in each valve branch. Another number of switching elements are of course conceivable, and these may be divided into a number of stacks being judged to be most appropriate for the respective application. It would for instance be possible to have all the switching elements of the valve branch arranged in one single stack held together by one single said arrangement 39. This way of arranging the switching elements makes the arrangement of the semiconductor chips thereof very compact with the possibility to keep the dimensions of valve halls down.

It is shown through the circle 50 to the right in FIG. 6 how for instance four semiconductor chips 30 may be arranged in parallel between each metal plate 32-34 of a switching element for being able to together take the current that may flow therethrough. Thus, the semiconductor chips 30, 31 shown in FIG. 5 and also FIGS. 6 and 7 may stand for such a parallel connection of a plurality of semiconductor chips.

Figure 7:
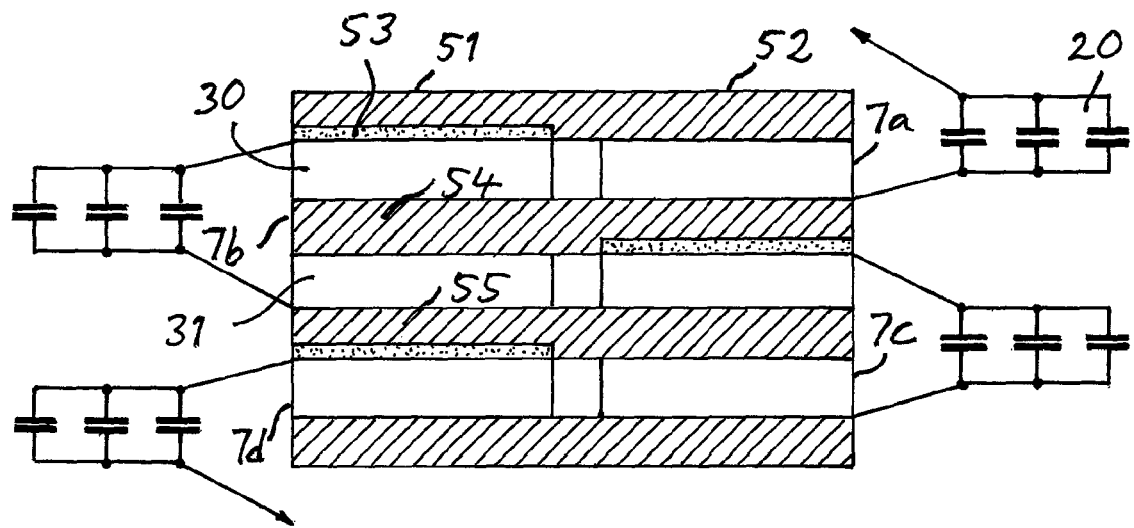
FIG. 7 is a very simplified view corresponding to FIG. 5 of a part of a so-called parallel stack of switching elements of a converter according to a second embodiment of the invention.
Figure 8:
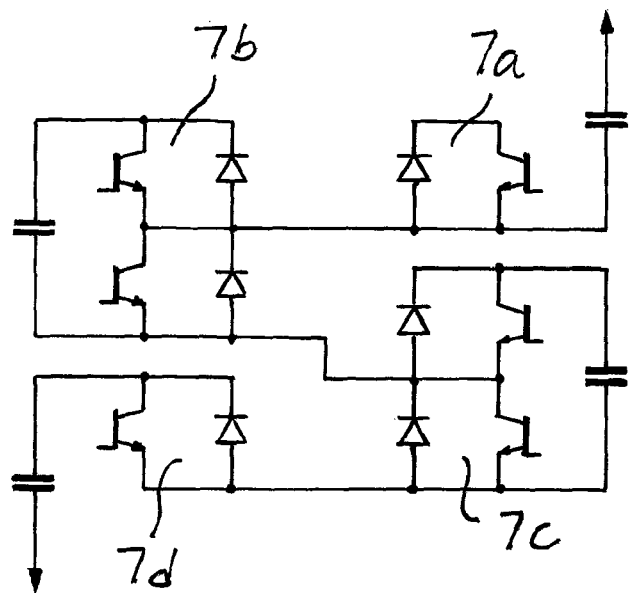
FIG. 8 is a circuit diagram of the part of said parallel stack shown in FIG. 7.

FIG. 7 illustrates schematically how switching elements in a converter according to a second embodiment of the invention may be arranged in a so-called "double" stack, and the circuit diagram thereof is shown in FIG. 8. Each of two parallel stacks 51, 52 comprises a plurality of superimposed switching elements 7b, 7d and 7a, 7c, respectively, each having semiconductor chips 30, 31 thereof arranged in a sub-stack. An electrically insulating layer 53 is sandwiched between and separates adjacent such sub-stacks, here arranged on the collector side of the semiconductor chip 30. Each sub-stack switching element comprises two metal plates 54, 55 extending to the other sub-stack. The parallel stacks 51, 52 are mutually displaced in the longitudinal direction thereof, so that for each switching element said two metal plates 54, 55 belonging thereto connect to and are in common to different adjacent switching elements of the other parallel stack so as to obtain a series connection of two switching elements separated by a said insulating layer 53 in one said parallel stack with a switching element of the other parallel stack arranged in the series connection between said two switching elements. This means that the two metal plates 54, 55 of the switching element 7b also belong to the switching elements 7a and 7c, respectively. This results in a series connection of the switching elements in the parallel stacks according to a zigzag-like pattern in the order 7a, 7b, 7c and 7d.

The parallel stacks 51, 52 shown in FIG. 7 may contain any appropriate number of superimposed switching elements and are held together by one arrangement of the type shown in FIG. 6 pressing the semiconductor chips thereof towards the metal plates. An advantage of this design with respect to the design shown in FIG. 5 is that the height of the stack may for a determined number of switching elements connected in series be reduced and the number of cooling medium (water) connections to metal plates will also be reduced.

Figure 9:
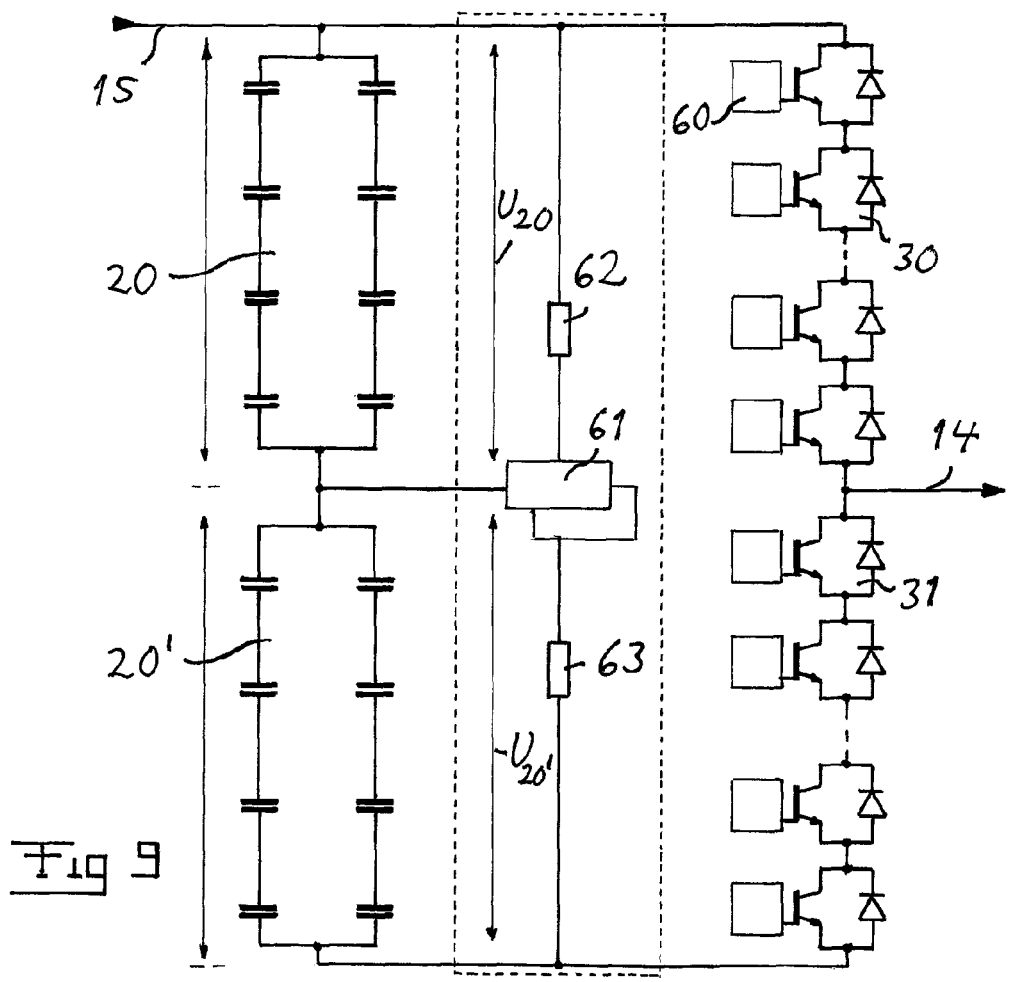
FIG. 9 is a circuit diagram illustrating a switching element of a converter according to a third embodiment of the invention.

FIG. 9 illustrates schematically a switching element in a converter according to a third embodiment of the invention. This switching element has totally 16 semiconductor chips 30, 31 connected in series. Gate drive units 60 used to control the respective semi-conductor device of the semiconductor chips are schematically illustrated. An external capacitor voltage divider 61 utilizing two voltage divider resistors 62, 63 for measuring the total voltage across the capacitors 20+20' as well as the difference of the voltages $U_{20}$ and $U_{20'}$ across these capacitors is arranged for detecting possible faults in any of said capacitors. The capacitor voltage measurement is also used in the control of the voltage division between switching elements in the same branch.

Figure 10:
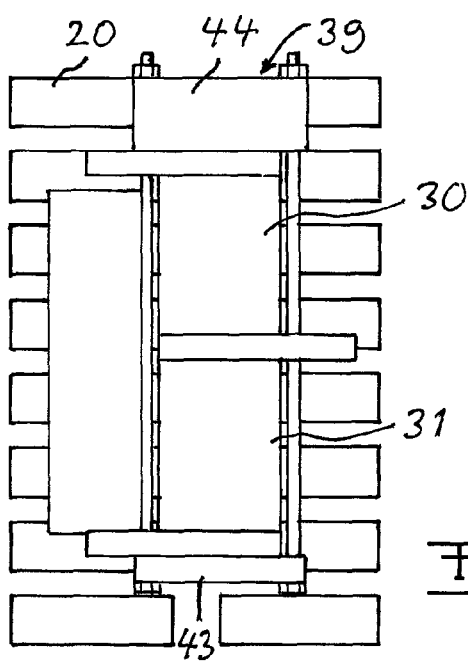
FIG. 10 is a very simplified view illustrating the switching element according to FIG. 9.
Figure 11:
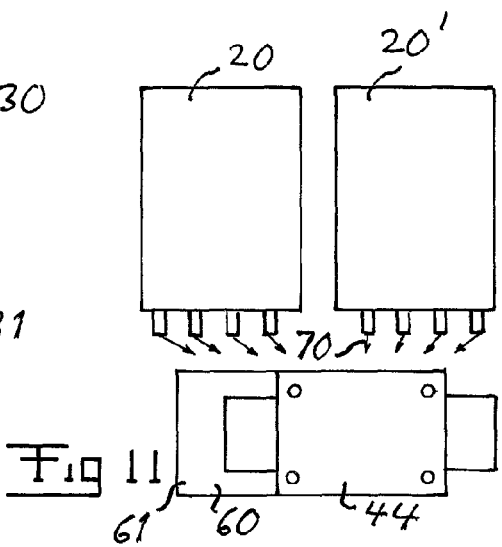
FIG. 11 is a very simplified view from above of the switching element shown in FIG. 10.

The switching element formed by 16 semiconductor chips arranged in one stack with metal plates sandwiched therebetween and held together by an arrangement 39 of the type described above is very schematically illustrated in FIG. 10. FIG. 11 shows the switching element from above, in which it is schematically indicated by arrows 70 how the capacitors are connected to the semiconductor chips. Such a switching element may typically have a voltage ($U_{20}+U_{20'}$) in the order of 20 kV across the capacitors thereof.

Such a larger number of semiconductor chips in the same switching element or cell results in a reduced number of switching elements in the converter, so that costs with respect to connections to the converter may be saved. However, this also means a lower number of different levels possible to obtain for pulses on said phase output, so that the alternating voltage resulting from said conversion will have a lower quality.

The invention is of course not in any way restricted to the embodiments described above, but many possibilities to modifications thereof will be apparent to a person with ordinary skill in the art without departing from the basic idea of the invention as defined in the appended claims.

"Plates" as used in this disclosure for the members of the arrangement pressed against opposite ends of the stacks is to be interpreted broadly and also covers more box-like members and members having different types of recesses, hollow spaces and the like.

The invention claimed is:

1. A multi-cell Voltage Source Converter having at least one phase leg connecting to opposite poles of a direct voltage side of the converter and comprising a series connection of switching elements, each said switching element having on one hand at least two semiconductor chips and on the other at least one energy storing capacitor, a mid point of said series connection forming a phase output being configured to be connected to an alternating voltage side of the converter and to divide the phase leg into an upper valve branch and a lower valve branch, wherein said semi-conductor chips of said switching elements are arranged in stacks comprising each at least two semi-conductor chips, and the converter comprises an arrangement configured to apply a pressure to opposite ends of each said stack for pressing said chips towards each other so as to obtain electric contact between semiconductor chips in said stack, wherein said semiconductor chips have a plate-like structure and are arranged with the large sides thereof directed in the direction of the extension of the stack, at least two semiconductor chips belong to the same switching element and adjacent semiconductor chips belonging to the same switching element are separated by a metal plate sandwiched therebetween for obtaining an electrical connection between the two chips by pressing them against said metal plate.

2. A converter according to claim 1, wherein said arrangement comprises means adapted to apply a spring loaded pressure to each said stack urging the two ends of the stack towards each other while releasing potential energy stored in members of said means.

3. A converter according to claim 2, wherein said members are springs acting on at least one end of each said stack.

4. A converter according to claim 2, wherein said arrangement comprises two end plates configured to be arranged close to opposite ends of a said stack and elongated members interconnecting said plates while determining the distance therebetween, and said members storing potential energy are arranged to act between at least one of said plates and the corresponding end of said stack for urging this end plate and stack end apart while pressing the stack together.

5. A converter according to claim 4, wherein said arrangement comprises means configured to allow a displacement of at least one of said plates along said interconnecting members in the longitudinal direction thereof for changing said distance and by that the pressure applied to said stack.

6. A converter according to claim 4, wherein said arrangement comprises a further plate configured to be applied onto one end of said stack and movable with respect to said elongated members in the longitudinal direction thereof, and said members storing potential energy are arranged to urge said further plate and a said end plate next thereto apart for pressing the stack together.

7. A converter according to claim 1, wherein said metal plates are arranged on both sides of each said semiconductor chip.

8. A converter according to claim 1, wherein each said stack comprises at least all semiconductor chips belonging to one switching element.

9. A converter according to claim 1, wherein each said stack comprises said semiconductor chips of a plurality of said switching elements.

10. A converter according to claim 1, wherein each said stack has the semiconductor chips of one switching element arranged in a sub-stack, all said sub-stacks to be pressed together by one and the same said arrangement are arranged on top of each other in one single stack, an electrically insulating layer is sandwiched between and separates adjacent such sub-stacks, and a conductor is arranged for electrically connecting adjacent sub-stacks and by that adjacent switching elements in said series connection to each other.

11. A converter according to claim 9, wherein said semiconductor chips to be pressed together by one and the same said arrangement are arranged in at least two parallel stacks, each said parallel stack comprises a plurality of superimposed switching elements each having said semiconductor chips thereof arranged in a sub-stack, all said sub-stacks of each of said parallel stacks are arranged on top of each other for forming one of said parallel stacks, an electrically insulating layer is sandwiched between and separates adjacent such sub-stacks, each sub-stack switching element comprises two metal plates separated by at least one semiconductor chip of this switching element, and said parallel stacks are mutually displaced in the longitudinal direction thereof, so that for each switching element said two metal plates belonging thereto connects to and are in common to different adjacent switching elements of the other parallel stack so as to obtain a series connection of two switching elements separated by a said insulating layer in one said parallel stack with a switching element of the other parallel stack arranged in this series connection between said two switching elements.

12. A converter according to claim 7, wherein said metal plates are provided with channels and the converter comprises means configured to circulate a cooling medium in said channels for cooling said semiconductor chips adjacent to said metal plates.

13. A converter according to claim 1, wherein each switching element comprises more than two said semiconductor chips arranged in a said stack.

14. A converter according to claim 13, wherein each said switching element has 2N said semiconductor chips following upon each other in a said stack, in which N is an integer >2.

15. A converter according to claim 1, wherein the number of the switching elements of said phase leg is >8, 12-32, 16-24 or 50-150.

16. A converter according to claim 1, wherein said semiconductor devices of the switching element chips are IGBTs (Insulated Gate Bipolar Transistor) or GTOs (Gate Turn-Off Thyristor).

17. A converter according to claim 1, wherein it is configured to have said direct voltage side connected to a direct voltage network for transmitting High Voltage Direct Current (HVDC) and the alternating voltage side connected to an alternating voltage phase line belonging to an alternating voltage network.

18. A converter according to claim 1, wherein it is configured to have a direct voltage across said two poles being 1 kV-1200 kV, 10 kV-1200 kV or 100 kV-1200 kV.

19. A plant for transmitting electric power comprising a direct voltage network and at least one alternating voltage network connected thereto through a station, said station being adapted to perform transmitting of electric power between the direct voltage network and the alternating voltage network and comprises at least one Voltage Source Converter adapted to convert direct voltage into alternating voltage and conversely, wherein said station of the plant comprises a Voltage Source Converter according to claim 1.

20. A converter according to claim 3, wherein said arrangement comprises two end plates configured to be arranged close to opposite ends of a said stack and elongated members interconnecting said plates while determining the distance therebetween, and said members storing potential energy are arranged to act between at least one of said plates and the corresponding end of said stack for urging this end plate and stack end apart while pressing the stack together.

* * * * *